(12) United States Patent
Sano et al.

(10) Patent No.: US 9,502,331 B2
(45) Date of Patent: Nov. 22, 2016

(54) ELECTRIC POWER CONVERTER WITH A SPRING MEMBER

(71) Applicant: DENSO CORPORATION, Kariya, Aichi-pref. (JP)

(72) Inventors: Tomohisa Sano, Kariya (JP); Yuu Yamahira, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/847,357

(22) Filed: Sep. 8, 2015

(65) Prior Publication Data

US 2016/0086873 A1 Mar. 24, 2016

(30) Foreign Application Priority Data

Sep. 18, 2014 (JP) ................. 2014-190053

(51) Int. Cl.
| | |
|---|---|
| *H01L 23/473* | (2006.01) |
| *H01L 23/367* | (2006.01) |
| *H01L 23/40* | (2006.01) |
| *H01L 23/22* | (2006.01) |
| *H01L 23/36* | (2006.01) |
| *H01L 23/00* | (2006.01) |
| *H01L 23/46* | (2006.01) |
| *H01L 25/11* | (2006.01) |

(52) U.S. Cl.
CPC ............. *H01L 23/473* (2013.01); *H01L 23/22* (2013.01); *H01L 23/36* (2013.01); *H01L 23/3675* (2013.01); *H01L 23/40* (2013.01); *H01L 23/46* (2013.01); *H01L 24/72* (2013.01); *H01L 25/117* (2013.01)

(58) Field of Classification Search
CPC ....... H01L 23/36; H01L 23/22; H01L 23/46; H01L 23/473; H01L 23/40; H01L 24/72; H01L 24/433; H05K 7/20927; H05K 7/20218; H05K 7/2029; H05K 7/20872
See application file for complete search history.

(56) References Cited

U.S. PATENT DOCUMENTS

| | | | |
|---|---|---|---|
| 8,792,244 B2 * | 7/2014 | Funatsu | H05K 7/20927 361/676 |
| 8,879,256 B2 * | 11/2014 | Ichijyo | H05K 7/20927 165/104.33 |
| 8,929,097 B2 * | 1/2015 | Nakasaka | H01L 23/473 361/688 |
| 8,963,322 B2 * | 2/2015 | Kiuchi | H01L 23/4012 257/686 |

(Continued)

FOREIGN PATENT DOCUMENTS

| | | |
|---|---|---|
| JP | 2005-143244 A | 6/2005 |
| JP | 2006-287108 A | 10/2006 |

(Continued)

*Primary Examiner* — Alonzo Chambliss
(74) *Attorney, Agent, or Firm* — Oliff PLC

(57) ABSTRACT

An electric power converter includes a semiconductor module, a cooling pipe, a pressing member and a supporting member. A pair of supporting wall portions is disposed so as to sandwich the semiconductor module, the cooling pipe, and the pressing member in an overlapping direction. A semiconductor element includes a small-sized semiconductor element, and a large-sized semiconductor element of which an outer shape is larger than that of the small-sized semiconductor element when projected onto a plane parallel to the overlapping direction. Within the semiconductor module, the large-sized semiconductor element is disposed closer to a connecting end portion side where a connecting portion of the pair of supporting wall portions are disposed than the small-sized semiconductor elements is.

7 Claims, 7 Drawing Sheets

(56) References Cited

U.S. PATENT DOCUMENTS

| | | | |
|---|---|---|---|
| 2006/0219396 A1 | 10/2006 | Abei et al. | |
| 2011/0194247 A1* | 8/2011 | Nakasaka | H01L 23/4093 361/689 |
| 2011/0194248 A1* | 8/2011 | Nakasaka | H01L 23/473 361/689 |
| 2011/0299243 A1* | 12/2011 | Yamaura | H05K 7/20927 361/688 |
| 2012/0250380 A1* | 10/2012 | Ichijyo | H05K 7/20927 363/123 |
| 2013/0058068 A1* | 3/2013 | Funatsu | H05K 7/20927 361/820 |
| 2014/0001630 A1* | 1/2014 | Takamura | H01L 23/433 257/719 |
| 2014/0098496 A1* | 4/2014 | Nakasaka | H01L 23/473 361/699 |
| 2014/0284765 A1* | 9/2014 | Kiuchi | H01L 28/40 257/532 |
| 2016/0079145 A1* | 3/2016 | Nakagawa | H01L 23/4012 361/699 |

FOREIGN PATENT DOCUMENTS

| | | | |
|---|---|---|---|
| JP | 2011211853 A | * | 10/2011 |
| JP | 2011-233688 A | | 11/2011 |
| JP | 2011239623 A | * | 11/2011 |

\* cited by examiner

ELECTRIC POWER CONVERTER WITH A SPRING MEMBER

CROSS-REFERENCE TO RELATED APPLICATION

This application is based on and claims the benefit of priority from earlier Japanese Patent Application No. 2014-190053 filed Sep. 18, 2014, the description of which is incorporated herein by reference.

TECHNICAL FIELD

The present disclosure relates to an electric power converter.

BACKGROUND

An electric power converter such as a DC-DC converter or an inverter, for example, is used for generating a driving power for energizing an AC motor, which is a power source for electric or hybrid vehicles.

The electric or hybrid vehicle or the like requires a large driving power in order to ensure a large driving torque from the AC motor.

For that reason, a heating value of semiconductor modules that incorporate a plurality of semiconductor elements therein constituting a power conversion circuit tends to become large.

Therefore, the electric power converter is provided with a cooler for cooling the plurality of semiconductor modules, and performs a thermal protection control that controls an operation of the semiconductor elements in accordance with a heating condition of each semiconductor module.

As such an electric power converter, there is one disclosed in Japanese Patent Application Laid-Open Publication No. 2005-143244, for example.

The Publication No. '244 discloses an electric power converter having a plurality of semiconductor modules, a plurality of cooling pipes for cooling the semiconductor modules, and a supporting member for supporting them.

The supporting member includes a pair of frames, a plate portion disposed on one end of the pair of frames, and a spring member disposed at another end of the pair of frames, and the semiconductor modules and the cooling pipes are supported between the plate portion and the spring member.

However, the electric power converter shown in the Publication No. '244 has the following problems.

In the electric power converter disclosed in the Publication No. '244, there is a possibility that a deformation during assembly or, a deformation due to a variation in shape may occur.

In the electric power converter, when pressing force is applied from the spring member to the semiconductor modules and the cooling pipes, reacting force is applied to the plate portion facing the spring member.

At this moment, since a rigidity of an open side of the supporting member opposite to the frames is lower than a side where the pair of frames are disposed, end portions of the open side in the plate portion facing the spring member may easily deform and incline so as to spread in an overlapping direction.

By the plate portion being inclined in this way, a pressure direction of the spring member is inclined toward the open side, and produces a bias in the pressure applied to the semiconductor modules and the cooling pipes.

For this reason, adhesion between the semiconductor modules and the cooling pipes are lowered in the open side.

Therefore, parts of the semiconductor modules in the open side will not be sufficiently cooled and the temperature of the semiconductor modules becomes high, so that there is a possibility that failure or performance degradation in the semiconductor module may occur.

SUMMARY

An embodiment provides an electric power converter capable of cooling semiconductor modules effectively so that the semiconductor modules can exert their true performances.

An electric power converter according to a first aspect includes a semiconductor module that incorporates two or more semiconductor elements therein, a cooling pipe disposed so as to overlap with the semiconductor module, a pressing member that presses the semiconductor module and the cooling pipe in an overlapping direction, and a supporting member that includes a pair of supporting wall portions that sandwich the semiconductor module, the cooling pipe, and the pressing member in the overlapping direction, and a connecting portion that connects ends of the supporting wall portions.

There are provided a small-sized semiconductor element, and a large-sized semiconductor element of which an outer shape is larger than that of the small-sized semiconductor element when projected onto a plane parallel to the overlapping direction as the semiconductor elements, and the large-sized semiconductor element is disposed on a side closer to the connecting portion than the small-sized semiconductor element is.

In the above electric power converter, since the open end sides of the pair of supporting wall portions of the supporting member disposed in an opposite side where the connecting portion is formed are not connected to each other, the open end side of the supporting member has a lower rigidity as compared to a rigidity of the connecting end portion side.

Therefore, the end portions of the open end side of the pair of supporting wall portions may be deformed so as to spread in the overlapping direction and incline by the pressing force of the pressing member.

At this time, although the semiconductor modules and the cooling pipes are in close contact in the connecting end portion side, adhesion between the semiconductor modules and the cooling pipes at the open end side is reduced.

Thus, the semiconductor modules in the connecting end portion side are efficiently cooled by the cooling pipes, while a cooling effect tends to decrease in the open end side.

In thermal resistance at an interface between the semiconductor module and the cooling pipe of the electric power converter, a ratio that the thermal resistance of the large-sized semiconductor element accounts for is greater than that of the small-sized semiconductor element.

Therefore, by disposing the large-sized semiconductor element having a large thermal resistance at the interface in the connecting end portion side where the semiconductor modules and the cooling pipes are easy to close contact, and by disposing the small-sized semiconductor element in the open end side where the semiconductor modules and the cooling pipes are relatively difficult to closely contact and the cooling efficiency is slightly inferior, the large-sized semiconductor elements and the small-sized semiconductor elements can be efficiently cooled.

Moreover, by disposing the small-sized semiconductor elements in the open end side, areas disposed in a range relatively difficult to closely contact can be reduced as compared with a case where the large-sized semiconductor elements is disposed in the open end side.

Thus, it is possible to reduce an influence on a cooling performance due to a reduction of the adhesions between the semiconductor modules and the cooling pipes.

Moreover, by employing the small-sized semiconductor elements, sizes of the semiconductor elements incorporated in the semiconductor module are reduced, thus it is possible to reduce the cost.

As described above, according to the electric power converter mentioned above, the semiconductor modules are efficiently cooled, and it is possible to allow the semiconductor modules to exert their true performances.

DETAILED DESCRIPTION OF THE PREFERRED EMBODIMENTS

Figure 1:
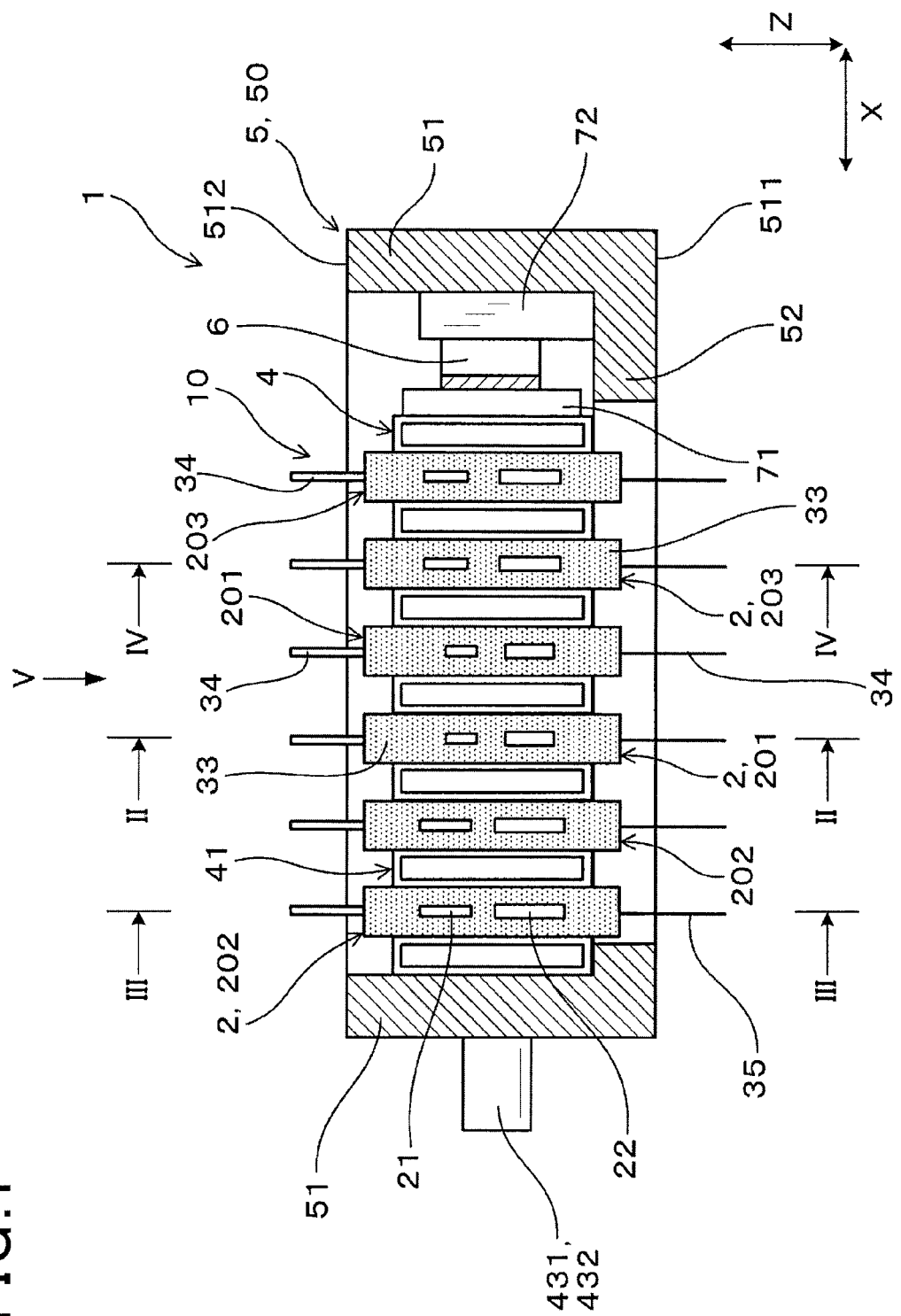
FIG. 1 shows a cross-sectional view of an electric power converter in a first embodiment.

In an electric power converter, it is preferable that a transverse dimension of a small-sized semiconductor element in a transverse direction that is orthogonal to both an overlapping direction and an aligning direction of a large-sized semiconductor element and a small-sized semiconductor elements is configured larger relative to a height dimension of the small-sized semiconductor element in the aligning direction.

In this case, the entire small-sized semiconductor element can be disposed at a position much nearer to the connecting end portion side.

Thereby, it is possible to more efficiently cool the small-sized semiconductor element.

In the electric power converter, there are provided an intermediate semiconductor module that incorporates an intermediate large element as the large-sized semiconductor element and an intermediate small element as the small-sized semiconductor element therein, and a plurality of outer semiconductor modules that incorporate an outer large element as the large-sized semiconductor element and an outer small elements as the small-sized semiconductor element as the semiconductor modules;

Moreover, an intermediate element area that is a sum of a projected area of the intermediate large element and projected area of the intermediate small element is configured smaller relative to an outer element area that is a sum of a projected area of the outer large element and a projected area of the outer small element.

Then, it is preferable that the intermediate semiconductor module is disposed so as to be sandwiched between the outer semiconductor modules in the overlapping direction.

In the electric power converter, when a deflection of the supporting member occurs, a degree of adhesion between the semiconductor modules and the cooling pipes at the open end side tends to decrease at a position near a center in the aligning direction.

Therefore, by disposing the intermediate semiconductor modules with the smaller heat generation than the outer semiconductor modules in this position, it is possible to cool each of the semiconductor modules efficiently.

In the electric power converter, it is preferable that the supporting member is formed by a case that accommodates the semiconductor module, the cooling pipe, and the pressing member.

In this case, by the case also serves as the supporting member, it is possible to reduce the number of parts of the electric power converter.

Thereby, it becomes possible to improve a productivity of the electric power converter and to reduce the cost.

In the electric power converter, it is preferable that the semiconductor module incorporates four or more semiconductor elements therein.

In this case, the number of semiconductor modules can be reduced, and it is possible to improve the productivity of the electric power converter.

In addition, it is possible to reduce a disposing space of the semiconductor modules.

Embodiments

First Embodiment

An embodiment according to an electric power converter will be described with reference to FIGS. 1 to 6.

Figure 6:
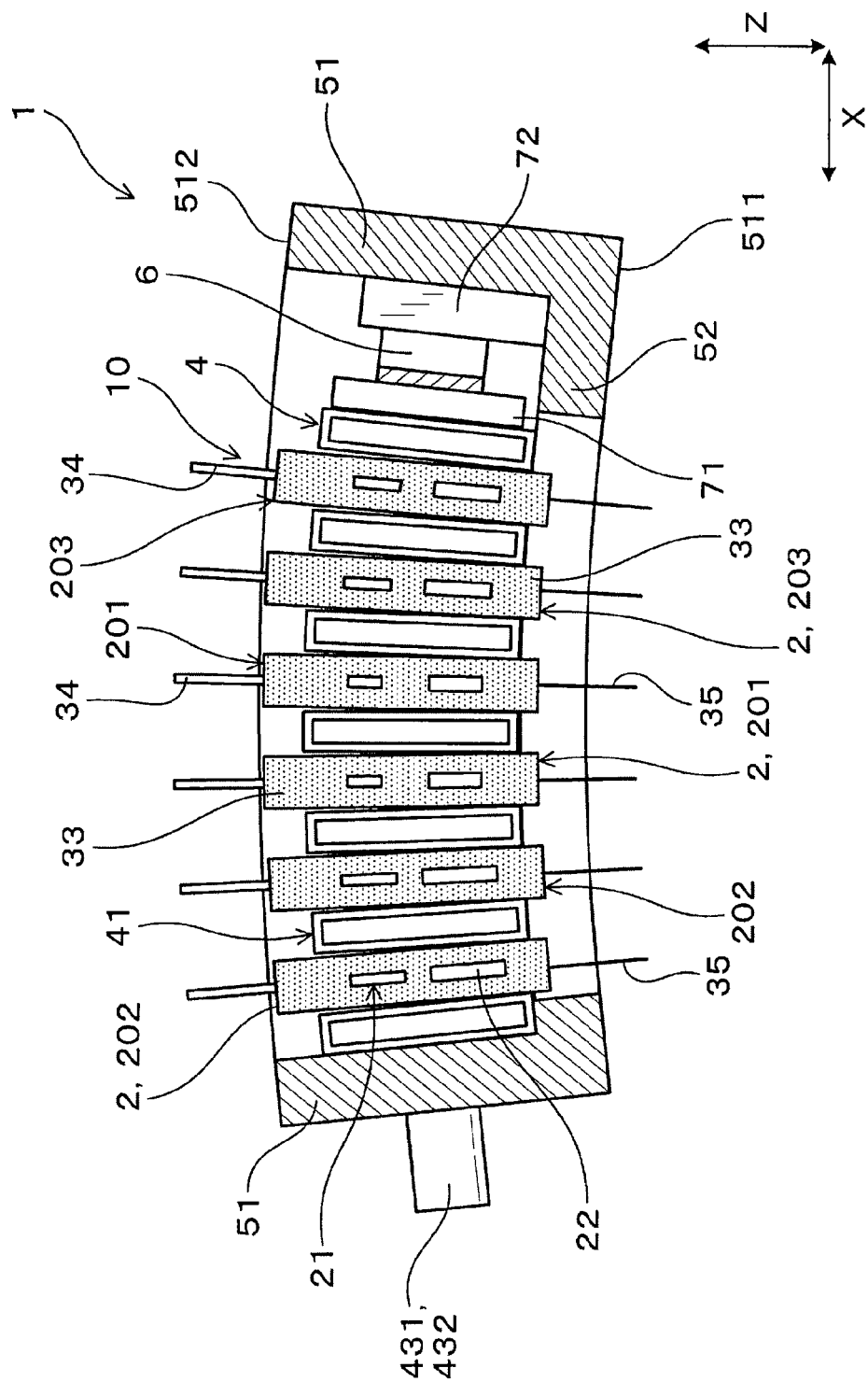
FIG. 6 shows a plan view of the deformed electric power converter in the first embodiment.

Note that FIG. 6 shows a deformation of the electric power converter exaggeratingly.

As shown in FIG. 1, an electric power converter 1 includes, semiconductor modules 2 that incorporate semiconductor elements 21, 22 therein, cooling pipes 41 disposed so as to overlap with the semiconductor modules 2, a pressing member 6 that presses the semiconductor modules 2 and the cooling pipes 41 in an overlapping direction X, and a supporting member 50 having a connecting portion 52 that connects ends of a pair of supporting wall portions 51 and the pair of supporting wall portions 51.

The pair of supporting wall portions 51 are disposed so as to sandwich the semiconductor module 2, the cooling pipe 41, and the pressing member 6 therebetween in the overlapping direction X.

The semiconductor elements 21, 22 include a small-sized semiconductor element 21, and a large-sized semiconductor element 22 of which an outer shape is larger than that of the small-sized semiconductor element 21 when projected onto a plane parallel to the overlapping direction X.

In the semiconductor module 2, the large-sized semiconductor element 22 is disposed on a side closer to the connecting portion 52 than the small-sized semiconductor element 21 is.

Details will be described further hereinafter.

In the present embodiment, a direction where the semiconductor module 2 and the cooling pipe 41 are overlapping is defined as the overlapping direction X, and a direction orthogonal to both the overlapping direction X and an aligning direction Z is defined as a transverse direction Y.

As shown in FIG. 1, the electric power converter 1 includes a plurality of semiconductor modules 2 that constitutes a part of a power conversion circuit, the cooling pipes 41 that cool the plurality of semiconductor modules 2, the pressing member 6 that presses the semiconductor modules 2 and the cooling pipes 41 in the overlapping direction X, and the supporting member 50 that supports the components mentioned above.

Figure 5:
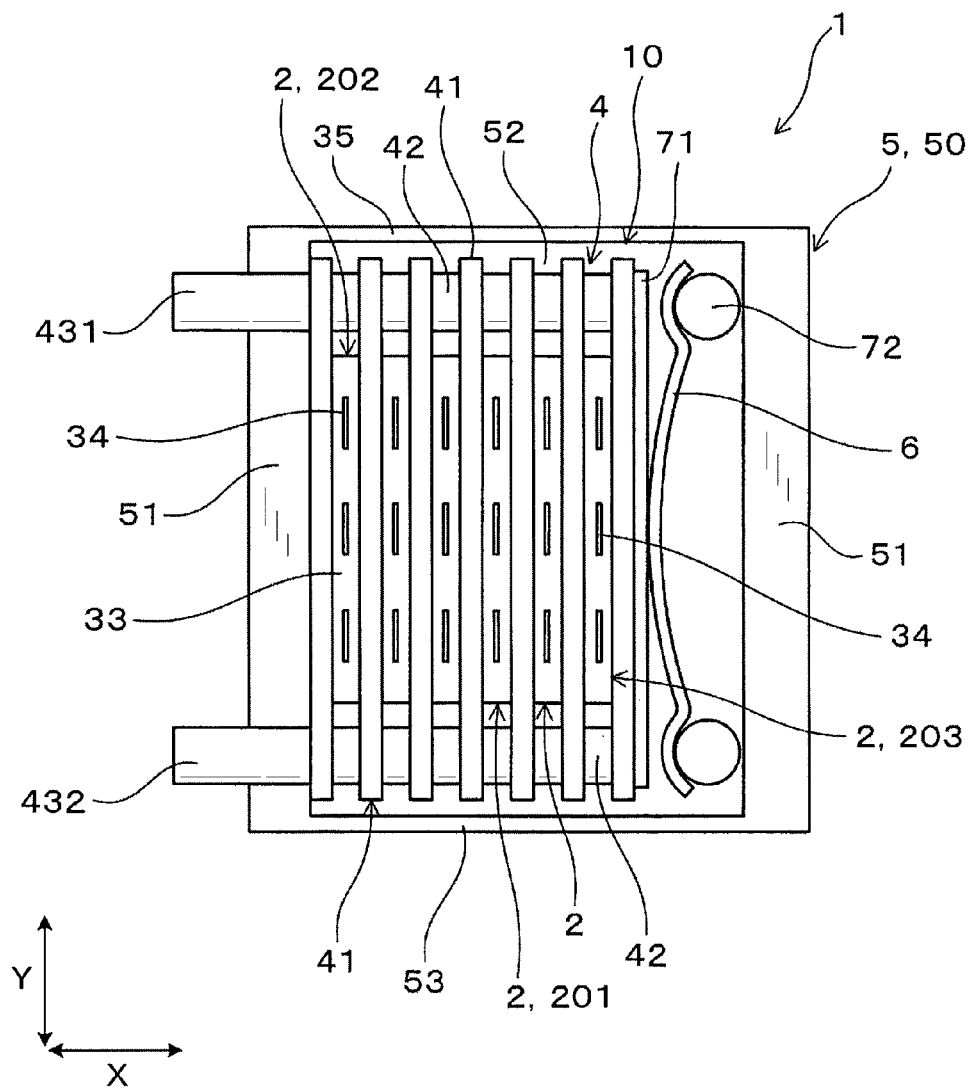
FIG. 5 shows a diagram viewed from a V arrow direction in FIG. 1.

As shown in FIGS. 1 and 5, the supporting member 50 includes the pair of supporting wall portions 51 that sandwich the semiconductor modules 2, the cooling pipes 41, and the pressing member 6 therebetween in the overlapping direction X, the connecting portion 52 that connects the ends disposed in a connecting end portion 511 side in the aligning direction Z of the pair of supporting wall portions 51, and a pair of side wall portions 53 that connect both ends in the transverse direction Y of the pair of supporting wall portions 51.

Furthermore, in the aligning direction Z, an open end portion 512 side of the supporting wall portions 51 and the side wall portions 53 opposite to the connecting end portion 511 side where the connection portion 52 is disposed is opened without being connected.

The plurality of semiconductor modules 2 and the plurality of cooling pipes 41 form a laminated semiconductor unit 10 by being laminated alternately.

The cooling pipes 41 are made of a metal such as aluminum, and the adjoining cooling pipes 41 are connected to each other by connecting pipes 42 in a vicinity of both end portions in the transverse direction Y.

In addition, a coolant introducing pipe 431 and a coolant discharging pipe 432 for circulating a coolant are disposed on the cooling pipe 41 disposed on one end in the overlapping direction X.

A cooler 4 is constituted by these cooling pipes 41, the connecting pipes 42, the coolant introducing pipe 431 and the coolant discharging pipe 432.

The coolant introducing pipe 431 and the coolant discharging pipe 432 are disposed so as to protrude toward the overlapping direction X from a front surface of the cooling pipe 41 disposed in a front end portion of the laminated semiconductor unit 10.

The coolant introduced from the coolant introducing pipe 431 passes through the connecting tubes 42 appropriately and is distributed to each cooling pipe 41, and flows in the longitudinal direction (transverse direction Y) of the cooling pipes 41.

Then, while flowing through the cooling pipes 41, the coolant exchanges heat with the semiconductor modules 2.

The coolant of which the temperature is raised by the heat exchange passes through downstream sides of the connecting pipes 42 appropriately, and is led to the coolant discharging pipe 432 and discharged.

As for a coolant, for example, a natural coolant such as ammonia or water, water mixed with ethylene glycol-based antifreeze, a fluorocarbon-based coolant such as FLUORINERT (registered trademark), another fluorocarbon-based coolant such as HCFC123 or HFC134a, a methanol, an alcohol-based coolant such as an alcohol, or a ketone-based coolant such as an acetone can be used.

As shown in FIGS. 1 to 4, each of the plurality of semiconductor modules 2 includes two small-sized semiconductor elements 21, and two large-sized semiconductor elements 22 having outer shapes larger than those of the small-sized semiconductor elements 21 when projected onto the plane parallel to the overlapping direction X as the semiconductor elements 21, 22.

In the present embodiment, the large-sized semiconductor element 22 is composed of a switching element, and the small-sized semiconductor element 21 is composed of a diode.

The two small-sized semiconductor elements 21 are disposed so as to align in the transverse direction Y, and each of the two large-sized semiconductor elements 22 is disposed at a position in the connecting end portion 511 side in the aligning direction Z of the respective small-sized semiconductor element 21.

As for the switching element used in the large-sized semiconductor element 22, an IGBT (insulated gate bipolar transistor), or a MOSFET (MOS field effect transistor) may be used, for example.

The diode used in the small-sized semiconductor element 21 is connected between a collector and an emitter of each of the large-sized semiconductor element 22 so as to flow a current from the emitter to the collector.

Further, when projected onto the plane parallel to the overlapping direction X, the small-sized semiconductor element 21 has a substantially rectangular shape, and a transverse dimension thereof in the transverse direction Y is configured larger than a height dimension thereof in the aligning direction Z.

The semiconductor module 2 is composed of a flat plate-shaped main body 33 formed by resin molding the large-sized semiconductor elements 22 and the small-sized semiconductor elements 21 therein, and main electrode terminals 34 and control terminals 35 projecting in opposite directions from end surfaces of the main body 33.

The main electrode terminals 34 are projecting toward the connecting end portion 511 side in the aligning direction Z, and the control terminals 35 are projected toward the open end portion 512 side in the aligning direction Z.

The main electrode terminals 34 are connected to bus bars (not shown), and a controlled power is inputted and outputted to the semiconductor module 2 via the bus bars.

In addition, the control terminals 35 are connected to a control circuit board (not shown), and a control current for controlling the large-sized semiconductor elements 22 is inputted.

In the present embodiment, there are the two intermediate semiconductor modules 201 and the four outer semiconductor modules 202, 203 as the semiconductor modules 2.

The two intermediate semiconductor modules 201 are connected to a three-phase AC rotating electric machine (MG1; not shown).

Among the four outer semiconductor modules 202, 203, two of them are first outer semiconductor modules 202 connected to a booster circuit, and the other two are second outer semiconductor modules 203 connected to another three-phase AC rotating electric machine (MG2; not shown).

Figure 2:
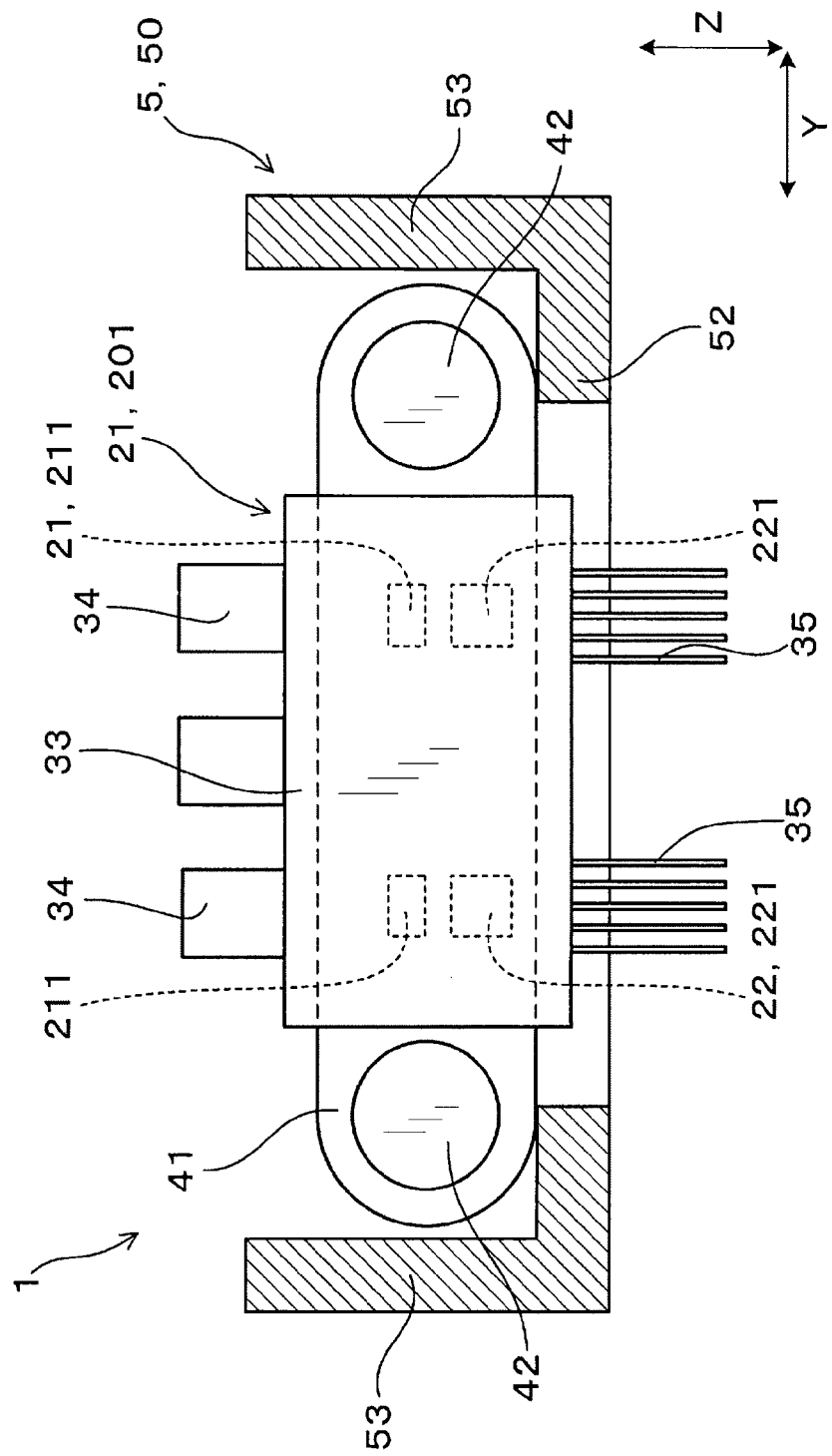
FIG. 2 shows a sectional view taken along the line II-II in FIG. 1.

As shown in FIG. 2, intermediate large elements 221 as the large-sized semiconductor elements 22 and intermediate small elements 211 as the small-sized semiconductor element 21 are incorporated within the intermediate semiconductor module 201.

When viewed from the overlapping direction X, a sum of a projected area of the intermediate large element 221 and a projected area of the intermediate small element 211 represents an intermediate element area Sc.

Figure 3:
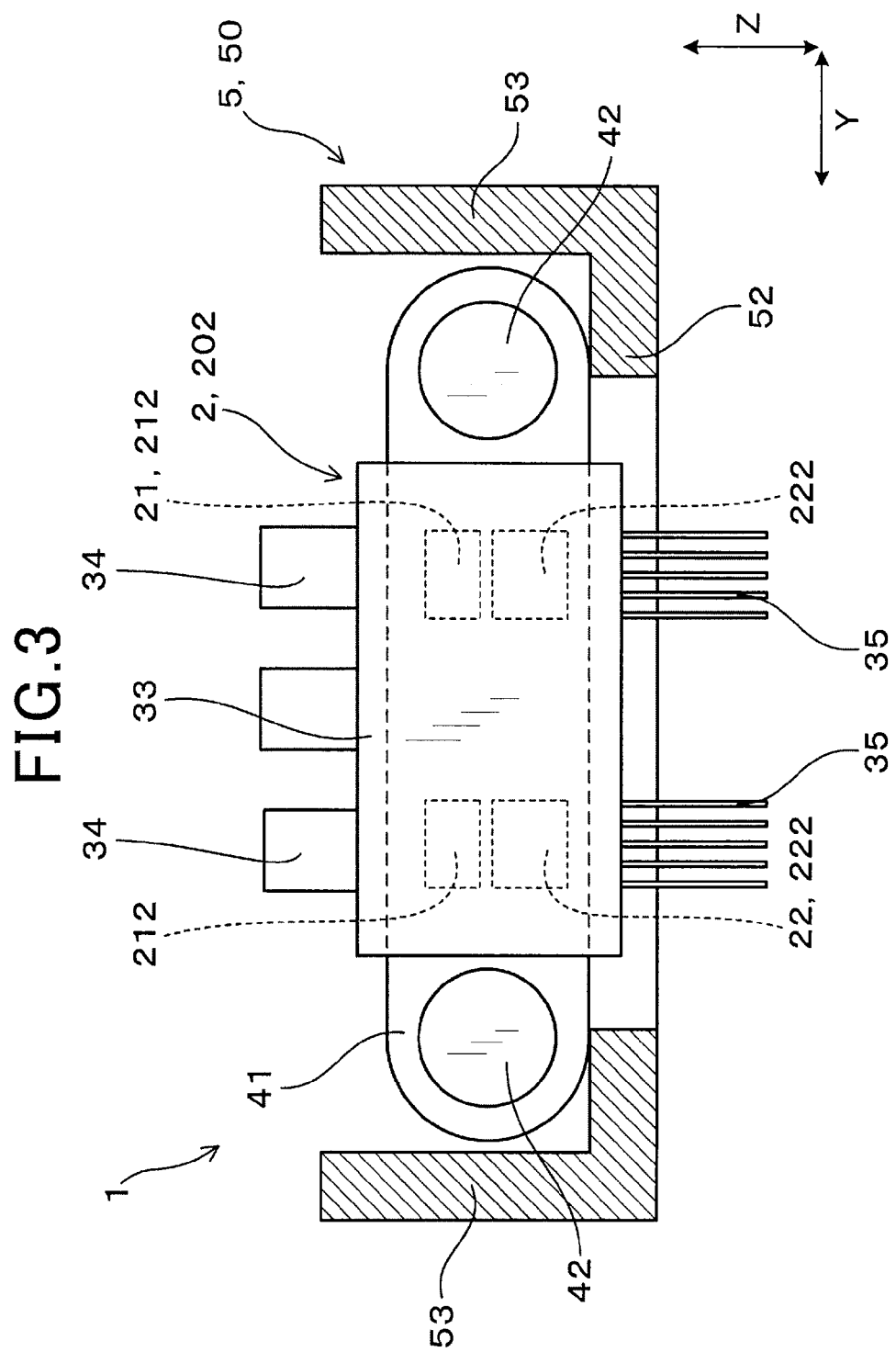
FIG. 3 shows a sectional view taken along the line III-III in FIG. 1.

As shown in FIG. 3, first outer large elements 222 as the large-sized semiconductor elements 22 and first outer small elements 212 as the small-sized semiconductor element 21 are incorporated within the first outer semiconductor module 202.

When viewed from the overlapping direction X, a sum of a projected area of the first outer large element 222 and a projected area of the first outer small element 212 represents a first outer element area So1.

It should be noted that the first outer element area So1 and the intermediate element area Sc have a relation of Sc<So1.

Figure 4:
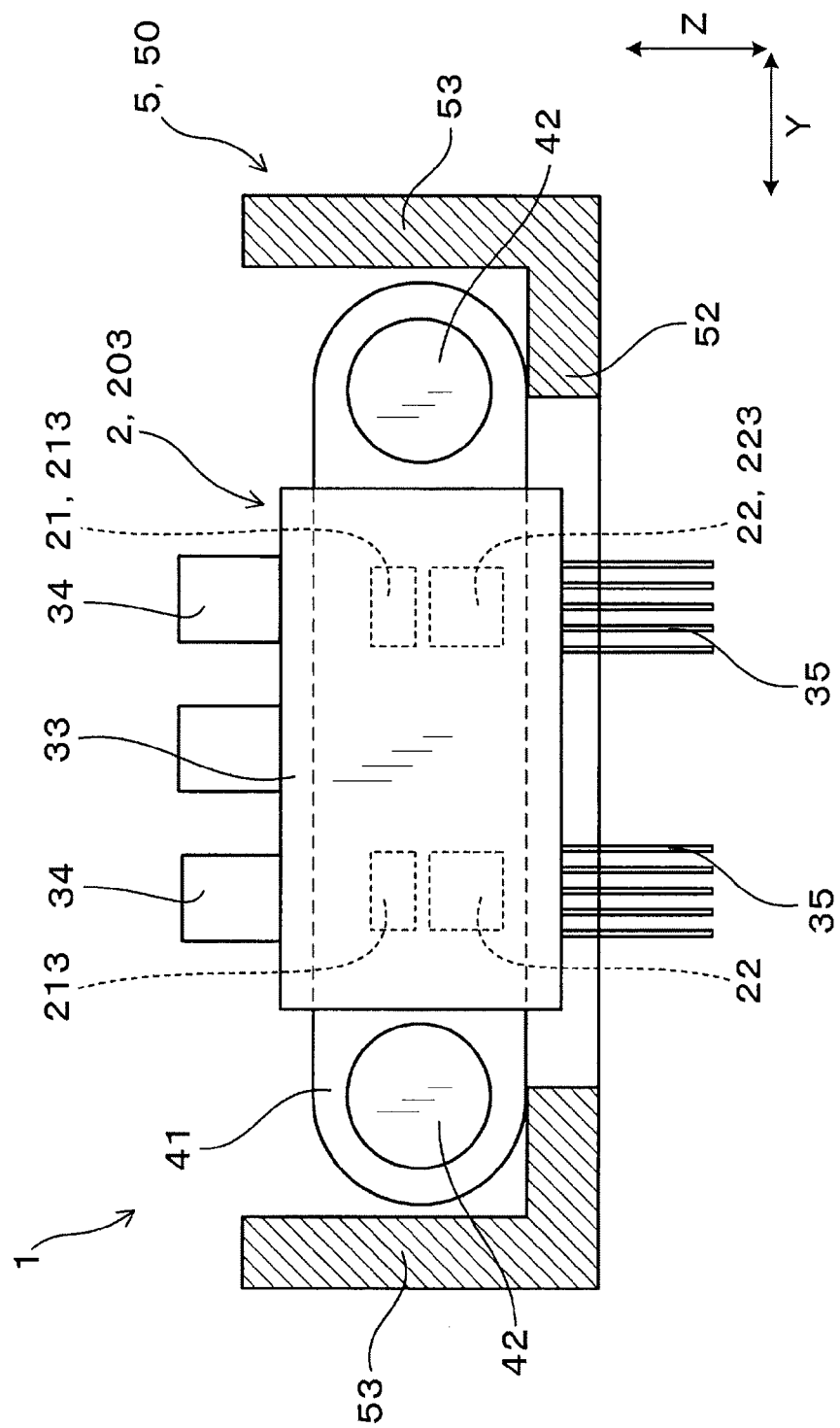
FIG. 4 shows a sectional view taken along the line IV-IV in FIG. 1.

As shown in FIG. 4, second outer large elements 223 as the large-sized semiconductor elements 22 and second outer small elements 213 as the small-sized semiconductor elements 21 are incorporated within the second outer semiconductor module 203.

When viewed from the overlapping direction X, a sum of a projected area of the second outer large element 223 and a projected area of the second outer small element 213 represents a second outer element area So2.

The second outer element area So2, the first outer element area So1, and the intermediate element area Sc have a relationship of Sc<So2<So1.

As shown in FIGS. 1 and 5, the laminated semiconductor unit 10 is accommodated inside the case 5 together with the pressing member 6.

The pressing member 6 presses and supports the laminated semiconductor unit 10 in the overlapping direction X by its urging force.

Further, interposing members 71, 72, which will be mentioned later, are disposed inside the case 5 together with the pressing member 6.

The pressing member 6 is a plate spring formed by bending, and is an elastic member that generates a pressing force by elastic deformation.

It should be noted that anything that generates the pressing force by elastic deformation other than metal springs such as a rubber member can also be used as the pressing member 6.

There is provided a contacting plate 71 having a flat-plate shape and supporting members 72 each of which has a cylindrical shape as the intervening members 71, 72 mentioned above.

The contacting plate 71 is disposed between the pressing member 6 and the laminated semiconductor unit 10, and is surface-contacting with the cooling pipe 41 disposed in an opposite side in the overlapping direction X of the cooling pipe 41 to which the coolant introducing pipe 431 and the coolant discharging pipe 432 are disposed.

The supporting members 72 are disposed between the pressing member 6 and one of the supporting wall portions 51.

Since end portions of the open end 512 side of the pair of supporting wall portions 51 of the supporting member 50 are not connected to each other, the open end 512 side of the supporting member 50 has a lower rigidity as compared to the connecting end portion 511 side.

Therefore, as shown in FIG. 6, the end portions of the open end 512 side of the pair of supporting wall portions 51 of the supporting member 50 may be deformed so as to spread in the overlapping direction X and incline by the pressing force of the pressing member 6 when the semiconductor modules 2, the cooling pipes 41, and the pressing member 6 are supported by the supporting member 50.

At this time, by a pressing direction of the pressing member 6 being inclined toward the open end 512 side, bias occurs in the pressing force applied on the laminated semiconductor unit 10.

Therefore, although the semiconductor modules 2 and the cooling pipes 41 are in close contact in the connecting end portion 511 side, adhesions between the semiconductor modules 2 and the cooling pipes 41 at the open end 512 side are reduced.

Thus, the semiconductor modules 2 in the connecting end portion 511 side are efficiently cooled by the cooling pipes 41, while a cooling effect tends to decrease in the open end 512 side.

In thermal resistance at an interface between the semiconductor module 2 and the cooling pipe 41 of the electric power converter 1, a ratio that the thermal resistance of the large-sized semiconductor element 22 accounts for is greater than that of the small-sized semiconductor element 21.

Therefore, by disposing the large-sized semiconductor element 22 having a large thermal resistance at the interface in the connecting end portion 511 side where the semiconductor modules 2 and the cooling pipes are easy to close contact, and by disposing the small-sized semiconductor element 21 in the open end 512 side where the semiconductor modules 2 and the cooling pipes 41 are relatively difficult to close contact and the cooling efficiency is slightly inferior, the large-sized semiconductor elements 22 and the small-sized semiconductor elements 21 can be efficiently cooled.

Moreover, by disposing the small-sized semiconductor elements 21 in the open end 512 side, areas disposed in a range relatively difficult to close contact can be reduces as compared with a case where the large-sized semiconductor elements 22 is disposed in the open end 512 side.

Thus, it is possible to reduce an influence on a cooling performance due to a reduction of the adhesions between the semiconductor modules 2 and the cooling pipes 41.

Moreover, by employing the small-sized semiconductor elements 21, sizes of the semiconductor elements 21, 22 incorporated in the semiconductor module 2 are reduced, thus it is possible to reduce the cost.

Further, there are the intermediate semiconductor modules 201 that incorporate the intermediate small elements 211 as the large-sized semiconductor elements 22 and the intermediate large elements 221 as the small-sized semiconductor elements 21, and the plurality of outer semiconductor modules 202, 203 that incorporate the outer large elements 222, 213 as the large-sized semiconductor elements 22 and the outer small elements 212, 223 as the small-sized semiconductor element 21 as the semiconductor modules 2.

The intermediate element area that is the sum of the projected area of the intermediate large element 221 and the projected area of the intermediate small element 211 is configured smaller relative to the outer element area that is the sum of the projected area of the outer large elements 222, 213 and the projected area of the outer small elements 212, 223.

In the overlapping direction X, the intermediate semiconductor modules 201 are disposed so as to be sandwiched between the outer semiconductor modules 202, 203.

When a deflection of the supporting member 50 occurs in the electric power converter 1, a degree of adhesion between the semiconductor modules 2 and the cooling pipes 41 at the open end 512 side tends to decrease at a position near a center in the aligning direction Z.

Therefore, by disposing the intermediate semiconductor modules 201 with the smaller heat generation than the outer semiconductor modules 202, 203 in this position, it is possible to cool each of the semiconductor modules 2 efficiently.

Moreover, the supporting member 50 is formed by the case 5 that accommodates the semiconductor modules 2, the cooling pipes 41, and the pressing member 6.

Therefore, by the case 5 also serves as the supporting member 50, it is possible to reduce the number of parts of the electric power converter 1.

Thereby, it becomes possible to improve a productivity of the electric power converter 1 and to reduce the cost.

Further, the semiconductor module 2 incorporates four or more semiconductor elements 21, 22 therein.

Therefore, the number of semiconductor modules 2 can be reduced, and it is possible to improve the productivity of the electric power converter 1.

In addition, it is possible to reduce a disposing space of the semiconductor modules 2.

Further, the electric power converter 1 has t plurality of semiconductor modules 2 and the plurality of cooling pipes 41, and it is more effective if the laminated semiconductor unit 10 is formed laminating the plurality of semiconductor modules 2 and the plurality of cooling pipes 41 alternately.

Although the inclination due to the deformation of the open end 512 side becomes larger when using the laminated semiconductor unit 10, it is possible to suppress the defects due to the heat of the semiconductor modules 2 from occurring, and it is possible to exert the performance of the semiconductor modules 2 by adopting the structure of the electric power converter 1 mentioned above.

Moreover, the pressing member 6 includes the elastic member that generates the pressing force by elastic deformation.

Therefore, the semiconductor modules 2 and the cooling pipes 41 can be stably supported by the pressing member 6 at constant pressure.

As described above, according to the electric power converter 1 of the present embodiment, the semiconductor modules 2 are effectively cooled, and the semiconductor modules 2 can exert their true performances.

Second Embodiment

Figure 7:
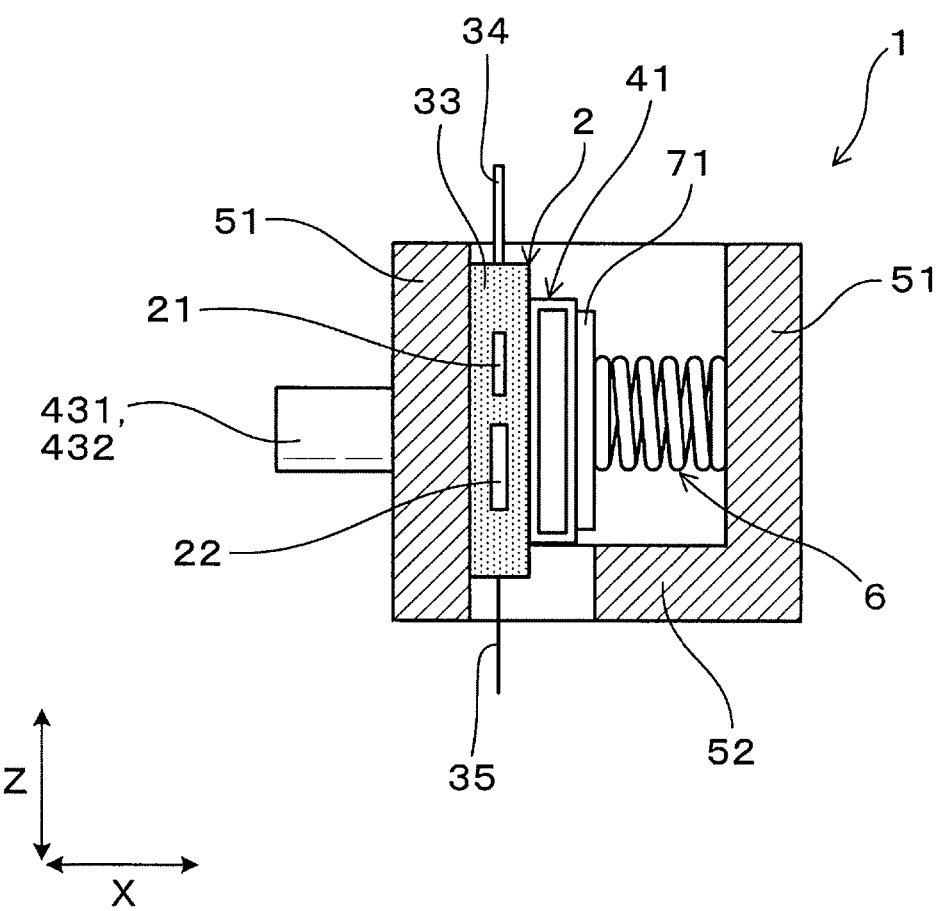
FIG. 7 shows a cross-sectional view of the electric power converter in a second embodiment.

The present embodiment is an example of alternating a part of the structure in the electric power converter 1 of the first embodiment, as shown in FIG. 7.

The electric power converter 1 of the present embodiment includes a single semiconductor module 2 and a single cooling pipe 41.

The semiconductor module 2 is supported by one of the supporting wall portions 51 of the supporting member 50 and the cooling pipe 41.

Further, the pressing member 6 is made of a spring member such as a coiled compression spring or a leaf spring, and is an elastic member that generates a pressing force by elastic deformation.

It should be appreciated that, in the second embodiment, components identical with or similar to those in the first embodiment are given the same reference numerals unless otherwise indicated, and structures and features thereof will not be described in order to avoid redundant explanation.

In the present embodiment, it is possible to obtain the same functions and effects as the first embodiment.

What is claimed is:

1. An electric power converter comprising:
   a semiconductor module that incorporates two or more semiconductor elements therein;
   a cooling pipe disposed so as to overlap with the semiconductor module;
   a pressing member that presses the semiconductor module and the cooling pipe in an overlapping direction; and
   a supporting member that includes a pair of supporting wall portions that sandwich the semiconductor module, the cooling pipe, and the pressing member in the overlapping direction, and a connecting portion that connects ends of the supporting wall portions; wherein,
   there are provided a small-sized semiconductor element, and a large-sized semiconductor element of which an outer shape is larger than that of the small-sized semiconductor element when projected onto a plane parallel to the overlapping direction as the semiconductor elements; and
   the large-sized semiconductor element is disposed on a side closer to the connecting portion than the small-sized semiconductor element is.

2. The electric power converter according to claim 1, wherein,
   a transverse dimension of the small-sized semiconductor element in a transverse direction that is orthogonal to both the overlapping direction and an aligning direction of the large-sized semiconductor element and the small-sized semiconductor elements is configured larger relative to a height dimension of the small-sized semiconductor element in the aligning direction.

3. The electric power converter according to claim 1, wherein,
   there are provided a plurality of semiconductor modules and a plurality of cooling pipes, and the plurality of semiconductor modules and the plurality of cooling pipes form a laminated semiconductor unit by being laminated alternately.

4. The electric power converter according to claim 3, wherein,
   there are provided an intermediate semiconductor module that incorporates an intermediate large element as the large-sized semiconductor element and an intermediate small element as the small-sized semiconductor element therein, and a plurality of outer semiconductor modules that incorporate an outer large element as the large-sized semiconductor element and an outer small elements as the small-sized semiconductor element as the semiconductor modules;
   an intermediate element area that is a sum of a projected area of the intermediate large element and projected area of the intermediate small element is configured smaller relative to an outer element area that is a sum of a projected area of the outer large element and a projected area of the outer small element; and
   the intermediate semiconductor module is disposed so as to be sandwiched between the outer semiconductor modules in the overlapping direction.

5. The electric power converter according to claim 1, wherein,
   the supporting member is formed by a case that accommodates the semiconductor module, the cooling pipe, and the pressing member.

6. The electric power converter according to claim 1, wherein,
   the semiconductor module incorporates four or more semiconductor elements therein.

7. The electric power converter according to claim 1, wherein,
   the pressing member includes an elastic member that generates pressing force by elastic deformation.

* * * * *